(12) United States Patent
Wong et al.

(10) Patent No.: US 7,050,301 B2
(45) Date of Patent: May 23, 2006

(54) INTEGRATED POWER SUPPLY AND AIR INLET UNIT

(75) Inventors: Henry Wong, Tempe, AZ (US); Dale C. Blankenship, Chandler, AZ (US); John H. Kelly, Phoenix, AZ (US); Dennis E. Liles, Chandler, AZ (US); Naufel C. Naufel, Tempe, AZ (US); Charles C. Hill, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 50 days.

(21) Appl. No.: 10/927,881

(22) Filed: Aug. 26, 2004

(65) Prior Publication Data

US 2006/0044753 A1    Mar. 2, 2006

(51) Int. Cl.
*H05K 7/20* (2006.01)

(52) U.S. Cl. ............... 361/695; 361/687; 361/692; 165/122; 454/184

(58) Field of Classification Search ............... 361/687, 361/692–695, 724–727; 312/223.1, 223.2, 312/223.3, 236; 165/122, 104.33, 104.34; 454/184
See application file for complete search history.

(56) References Cited

U.S. PATENT DOCUMENTS

| | | | | |
|---|---|---|---|---|
| 4,479,198 A | * | 10/1984 | Romano et al. | 361/687 |
| 5,497,288 A | * | 3/1996 | Otis et al. | 361/687 |
| 5,813,243 A | * | 9/1998 | Johnson et al. | 62/259.2 |
| 6,000,623 A | * | 12/1999 | Blatti et al. | 236/49.3 |
| 6,086,476 A | * | 7/2000 | Paquin et al. | 454/184 |
| 6,163,454 A | * | 12/2000 | Strickler | 361/695 |
| 6,198,628 B1 | * | 3/2001 | Smith | 361/695 |
| 6,341,064 B1 | * | 1/2002 | Bradley | 361/695 |
| 6,597,569 B1 | * | 7/2003 | Unrein | 361/687 |
| 6,616,248 B1 | * | 9/2003 | Obuse et al. | 303/119.3 |
| 6,650,535 B1 | * | 11/2003 | Moss et al. | 361/687 |
| 6,704,196 B1 | * | 3/2004 | Rodriguez et al. | 361/687 |
| 6,924,977 B1 | * | 8/2005 | Bestwick et al. | 361/687 |
| 2003/0214785 A1 | | 11/2003 | Perazzo | |

FOREIGN PATENT DOCUMENTS

EP    1 330 150 A2    7/2003

* cited by examiner

*Primary Examiner*—Michael Datskovskiy
(74) *Attorney, Agent, or Firm*—Kevin D. Wills

(57) ABSTRACT

An integrated power supply air inlet unit (124) coupled to slidably insert into a first interspace region (120) of an embedded computer chassis (100), where the first interspace region is defined by a module portion (102), a rear surface (110) and a first side surface (112), includes a power supply (128) coupled to supply power to the embedded computer chassis, and a front surface (130) that is substantially perpendicular to the first side surface. A cooling air mass (140) is drawn into the embedded computer chassis through the front surface in a direction substantially perpendicular (150) to the front surface, where upon entering the integrated power supply air inlet unit the cooling air mass is turned substantially ninety degrees to flow over the module portion in a direction substantially parallel the front surface, and where the integrated power supply air inlet unit is hot-swappable in the embedded computer chassis.

27 Claims, 2 Drawing Sheets

INTEGRATED POWER SUPPLY AND AIR INLET UNIT

RELATED APPLICATIONS

Related subject matter is disclosed in U.S. patent application entitled "METHOD AND APPARATUS FOR COOLING A MODULE PORTION" having application Ser. No. 10,927,882 and filed on the same date herewith and assigned to the same assignee.

BACKGROUND OF THE INVENTION

Existing electronic equipment cabinets generally employ forced air convection cooling of electronic modules mounted in chassis within the cabinet. Many prior art cabinet and chassis configurations circulate cooling air in a side-to-side configuration. The side-to-side cooling pattern has the disadvantage of pre-heating air for each successive chassis when chassis are placed side-by-side as is common in telecommunications and other embedded applications. As processor speed increase and electronic modules generate more thermal energy, prior art configurations and methods of cooling electronic modules and their cabinets will become inadequate.

Accordingly, there is a significant need for an apparatus and method that overcomes the deficiencies of the prior art outlined above.

BRIEF DESCRIPTION OF THE DRAWINGS

Referring to the drawing.

Figure 1:
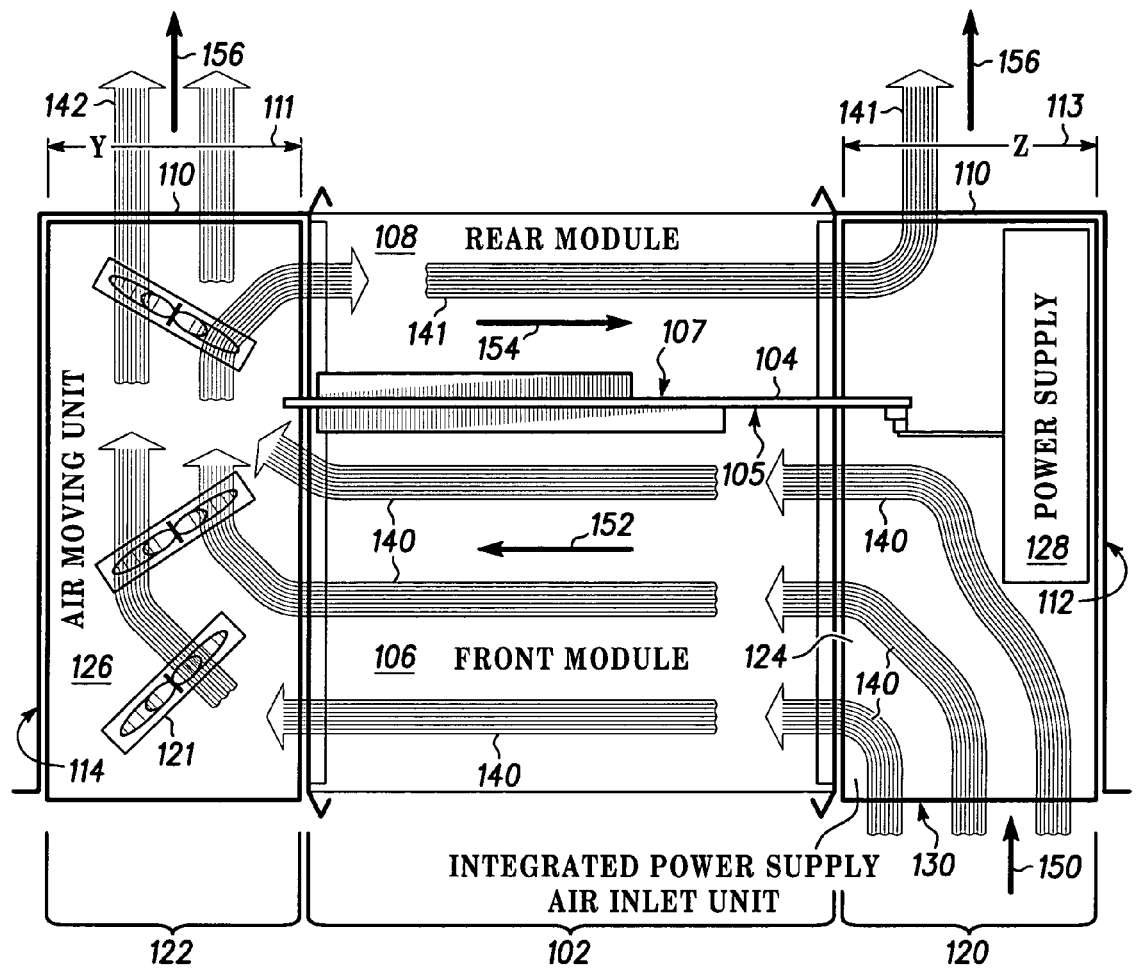
FIG. 1 is a top plan cut-away view of an embedded computer chassis in accordance with an embodiment of the invention.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings (where like numbers represent like elements), which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

FIG. 1 is a top plan cut-away view of an embedded computer chassis 100 in accordance with an embodiment of the invention. As shown in FIG. 1, embedded computer chassis 100 can be defined by a plurality of outer surfaces including a rear surface 110, first side surface 112 and second side surface 114, where rear surface 110 can be substantially perpendicular to both first side surface 112 and second side surface 114.

Embedded computer chassis 100 can include a module portion 102 coupled for receiving one or more modules. For example, module portion 102 can be coupled for receiving at least one of front module 106 or rear module 108. As an example, front module 106 can be coupled to front portion 105 of backplane 104, and rear module 108 can be coupled to rear portion 107 of backplane 104. Backplane 104 can include hardware and software necessary to implement a data network using a parallel multi-drop topology, switched fabric topology, and the like. Backplane 104 is disposed substantially vertical within embedded computer chassis 100 and substantially parallel to rear surface 110. With the addition of more chassis to embedded computer chassis 100, backplane 104 can extend vertically as well as chassis are "stacked" with embedded computer chassis 100.

As an example of an embodiment, front module 106 can be a payload module, switch module, and the like. Rear module 108 can be a rear transition module to couple embedded computer chassis 100 to other chassis, networks devices, and the like. Each of front module 106 and rear module 108 can include a printed circuit board (PCB) having any number of electronic devices located thereon, for example, and without limitation, processors, memory, storage devices, I/O elements, and the like. In an embodiment, front module 106 and rear module 108 are substantially horizontally disposed in conjunction with the orientation of backplane 104.

Embedded computer chassis 100 can be used in any application requiring modular, embedded computing resources, for example and without limitation, telecommunications, industrial control, system control and data acquisition (SCADA), and the like. In the exemplary embodiment depicted in FIG. 1, embedded computer chassis 100 can be a 1U chassis, which refers to the height, thickness, number of slots, and the like, of the embedded computer chassis 100. 1U modules can be coupled together and "stacked" to form a distributed computing system coupled to share resources from each 1U chassis. When stacked, backplane 104 can extend vertically to couple each of the stacked modules.

As is known in the art, "U" and multiples of "U" can refer to both the width of a module and the height of the embedded computer chassis 100. In an embodiment, "U" can measure approximately 1.75 inches. As an example of an embodiment, module portion 102 can be coupled to accommodate 6U form factor front module 106 and rear module 108. The invention is not limited to a 1U chassis or 6U modules. Any size chassis or modules, for example 5U, 10U, and the like, chassis, and 3U, 9U and the like, modules are within the scope of the invention. The "U" terminology is not limiting of the invention. As such, the invention is not limited to "U" as a form factor reference. Other form factor reference notations and increments are within the scope of the invention.

In an embodiment, embedded computer chassis 100 can include backplane 104, front module 106 and rear module 108 coupled to operate a parallel multi-drop network, for example, a VERSAmodule Eurocard (VMEbus) network using any of the VMEbus protocols known in the art. VMEbus is defined in the ANSI/VITA 1-1994 and ANSI/VITA 1.1-1997 standards, promulgated by the VMEbus International Trade Association (VITA), P.O. Box 19658, Fountain Hills, Ariz., 85269 (where ANSI stands for American National Standards Institute). In an embodiment of the invention, VMEbus based protocols can include, but are not limited to, Single Cycle Transfer protocol (SCT), Block Transfer protocol (BLT), Multiplexed Block Transfer protocol (MBLT), Two Edge VMEbus protocol (2eVME) and Two Edge Source Synchronous Transfer protocol (2eSST). These VMEbus protocols are known in the art.

In another embodiment, embedded computer chassis 100 can include backplane 104, front module 106 and rear module 108 coupled to operate a switched fabric. Switched fabric can use switch module as a central switching hub with any number of payload modules coupled to switch module. Switched fabric can be based on a point-to-point, switched input/output (I/O) fabric, whereby cascaded switch devices interconnect end node devices. In an embodiment, switched fabric can be configured as a star topology, mesh topology, and the like as known in the art for communicatively coupling switched fabrics. Switched fabric can include both module-to-module (for example computer systems that support I/O module add-in slots) and chassis-to-chassis environments (for example interconnecting computers, external storage systems, external Local Area Network (LAN) and Wide Area Network (WAN) access devices in a data-center environment). Switched fabric can be implemented by using one or more of a plurality of switched fabric network standards, for example and without limitation, InfiniBand™, Serial RapidIO™, FibreChannel™, Ethernet™, PCI Express™, Hypertransport™, and the like. Switched fabric is not limited to the use of these switched fabric network standards and the use of any switched fabric network standard is within the scope of the invention.

In yet another embodiment, embedded computer chassis 100 can include backplane 104, front module 106 and rear module 108 coupled to operate a VXS network where backplane 104 conforms to the VERSAmodule Eurocard (VMEbus) switched serial standard backplane (VXS) as set forth in VITA 41 promulgated by VMEbus International Trade Association (VITA), P.O. Box 19658, Fountain Hills, Ariz., 85269. VXS network includes a switched fabric and a VMEbus network, both located on backplane 104. In other words, a VXS network includes a switched fabric coincident, and operating concurrently with a VMEbus network on backplane 104.

In still another embodiment, backplane 104, front module 106 and rear module 108 can operate using CompactPCI® protocol. CompactPCI protocol, including mechanical dimensions, electrical specifications, and the like, are known in the art and set forth in the CompactPCI Specification, by PCI Industrial Computer Manufacturers Group (PCIMG™), 301 Edgewater Place, Suite 220, Wakefield, Mass.

As shown in FIG. 1, first side surface 112, rear surface 110 and module portion 102 define first interspace region 120. In one embodiment, first interspace region 120 extends the height of embedded computer chassis 100. In another embodiment, first interspace region 120 extends a portion of the height of embedded computer chassis 100. The specific size and configuration of first interspace region 120 can be tailored by one skilled in the art to fit a specific application and be within the scope of the invention.

Also, second side surface 114, rear surface 110 and module portion 102 define second interspace region 122. In one embodiment, second interspace region 122 extends the height of embedded computer chassis 100. In another embodiment, second interspace region 122 extends a portion of the height of embedded computer chassis 100. The specific size and configuration of second interspace region 122 can be tailored by one skilled in the art to fit a specific application and be within the scope of the invention.

In an embodiment, embedded computer chassis 100 can include integrated power supply air inlet unit 124 coupled to slidably insert into the first interspace region 120. Integrated power supply air inlet unit 124 can couple to backplane 104 and include power supply 128 to supply power to embedded computer chassis 100. In an embodiment, integrated power supply air inlet unit 124 can be hot-swappable in embedded computer chassis 100 so that slidably inserting or removing integrated power supply air inlet unit 124 does not disrupt power to embedded computer chassis 100 given that another power supply is coupled to embedded computer chassis 100.

In an embodiment, integrated power supply air inlet unit 124 includes front surface 130 that is substantially perpendicular to first side surface 112. Front surface 130 is an integral component of integrated power supply air inlet unit 124. In an embodiment, front surface 130 can include one or more orifices to allow cooling air mass 140 to be drawn into embedded computer chassis 100 in a direction substantially perpendicular 150 to front surface 130. Cooling air mass 140 can function to cool heat-generating electronics associated with front module 106, rear module 108, backplane 104, power supply 128, and the like.

In an embodiment, embedded computer chassis 100 can include air-moving unit 126 coupled to slidably insert into the second interspace region 122. Air-moving unit 126 can couple to backplane 104. In an embodiment, air-moving unit 126 can draw power from backplane 104 or from another dedicated circuit in embedded computer chassis 100. In an embodiment, air-moving unit 126 can be hot-swappable in embedded computer chassis 100 so that slidably inserting or removing air-moving unit 124 does not disrupt the operation of embedded computer chassis 100.

In an embodiment, air-moving unit 126 can include any number of air-moving apparatuses 121, which can include, for example and without limitation, fans, blowers, and the like. Air-moving apparatus 121 can be configured in any combination of "push" or "pull" patterns. In other words, air-moving apparatus 121 can either "push" cooling air mass 140 over module portion 102, "pull" cooling air mass 140 over module portion 102, or any combination thereof. In pushing or pulling cooling air mass 140 over modules, cooling air mass 140 can flow over one or both sides of modules. As an example of an embodiment, air-moving unit 126 can include one or more muffin fans. The number and operating point of air-moving apparatus 121 can be chosen to fit a particular application and is well within the abilities of one of ordinary skill in the art.

In an embodiment, air-moving unit 126 is coupled to draw cooling air mass 140 over front module 106 in a direction substantially parallel 152 to backplane 104 and front surface 130. Cooling air mass 140 can flow over one or both sides of front module 106. Once cooling air mass 140 reaches air-moving unit 126, cooling air mass 140 can be turned approximately ninety degrees toward rear surface 110.

In an embodiment, cooling air mass 140 can be split into first portion of cooling air mass 141 and second portion of cooling air mass 142 after passing through air-moving apparatus 121. In an embodiment, air-moving unit 126 is coupled to push first portion of cooling air mass 141 over rear module 108 in a substantially opposite direction 154 substantially parallel to backplane 104. First portion of cooling air mass 141 can flow over one or both sides of rear module 108. In an embodiment, embedded computer chassis 100 is coupled to exhaust second portion of cooling air mass 142 through first portion 111 of rear surface 110 in a direction substantially perpendicular 156 to rear surface 110. Also, in an embodiment, embedded computer chassis 100 is coupled to exhaust first portion of cooling air mass 141 through second portion 113 of rear surface 110 in a direction substantially perpendicular 156 to rear surface 110. Both first portion 111 and second portion 113 of rear surface 110 can have one or more orifices sized by one skilled in the art for a particular application. The orifices can be sized such that first portion of cooling air mass 141 and second portion of cooling air mass 142 are proportioned as needed for a particular application.

In an embodiment, first portion 111 of rear surface 110 has a dimension "Y" and second portion 113 of rear surface 110 has a dimension "Z." In an embodiment, the ratio of first portion 111 to second portion 113 can range between 0.5:2.0 and 2.0:0.5. In another embodiment, the ratio of first portion 111 to second portion 113 is substantially 1:1.

Figure 2:
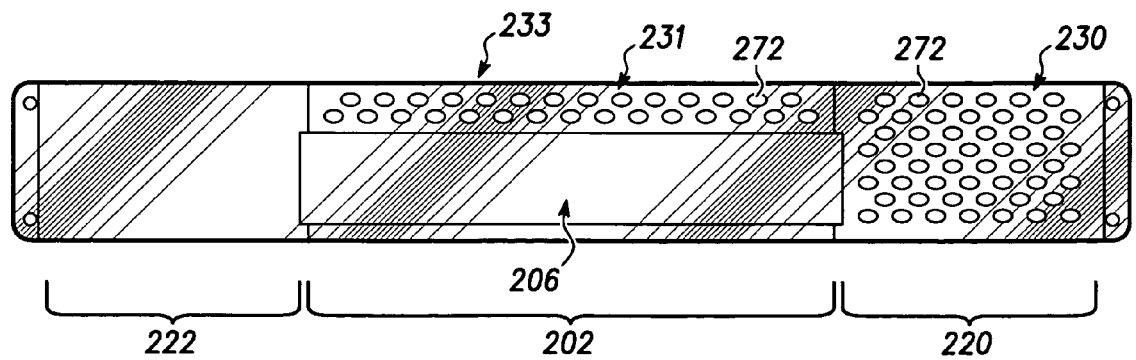
FIG. 2 is a front elevation view of an embedded computer chassis in accordance with another embodiment of the invention.

FIG. 2 is a front elevation view of an embedded computer chassis 200 in accordance with another embodiment of the invention. As shown in FIG. 2, embedded computer chassis 200 can include module portion 202, first interspace region 220, third interspace region 222 and top surface 233. First interspace region 220, third interspace region 222 and module portion 202 will be described with more particularity in reference to FIG. 3. Module portion 202 can include front module 206 analogous to that described with reference to FIG. 1. In an embodiment, first interspace region 220 can include front surface 230 and module portion 202 can include upper front surface 231. In an embodiment, upper front surface 231 can be a fixed part of embedded computer chassis 200. In another embodiment, upper front surface 231 can be a part of front module 206. Front surface 230 and upper front surface 231 are substantially perpendicular to top surface 233. Also, upper front surface 231 is substantially parallel to front surface 230. In an embodiment, front surface 230 and upper front surface 231 can include one or more orifices 272 to permit cooling air mass to enter embedded computer chassis 200 in a direction substantially perpendicular to front surface 230 and upper front surface 231.

Embedded computer chassis 200 can be used in any application requiring modular, embedded computing resources, for example and without limitation, telecommunications, industrial control, system control and data acquisition (SCADA), and the like. In the embodiment depicted in FIG. 2, embedded computer chassis 200 can be a 1U chassis, which refers to the height, thickness, number of slots, and the like, of the embedded computer chassis 200. 1U modules can be coupled together and "stacked" to form a distributed computing system coupled to share resources from each 1U chassis. The invention is not limited to a 1U chassis. Any size chassis, for example 5U, 10U, and the like, chassis are within the scope of the invention. The "U" terminology is not limiting of the invention. As such, the invention is not limited to "U" as a form factor reference. Other form factor reference notations and increments are within the scope of the invention.

Figure 3:
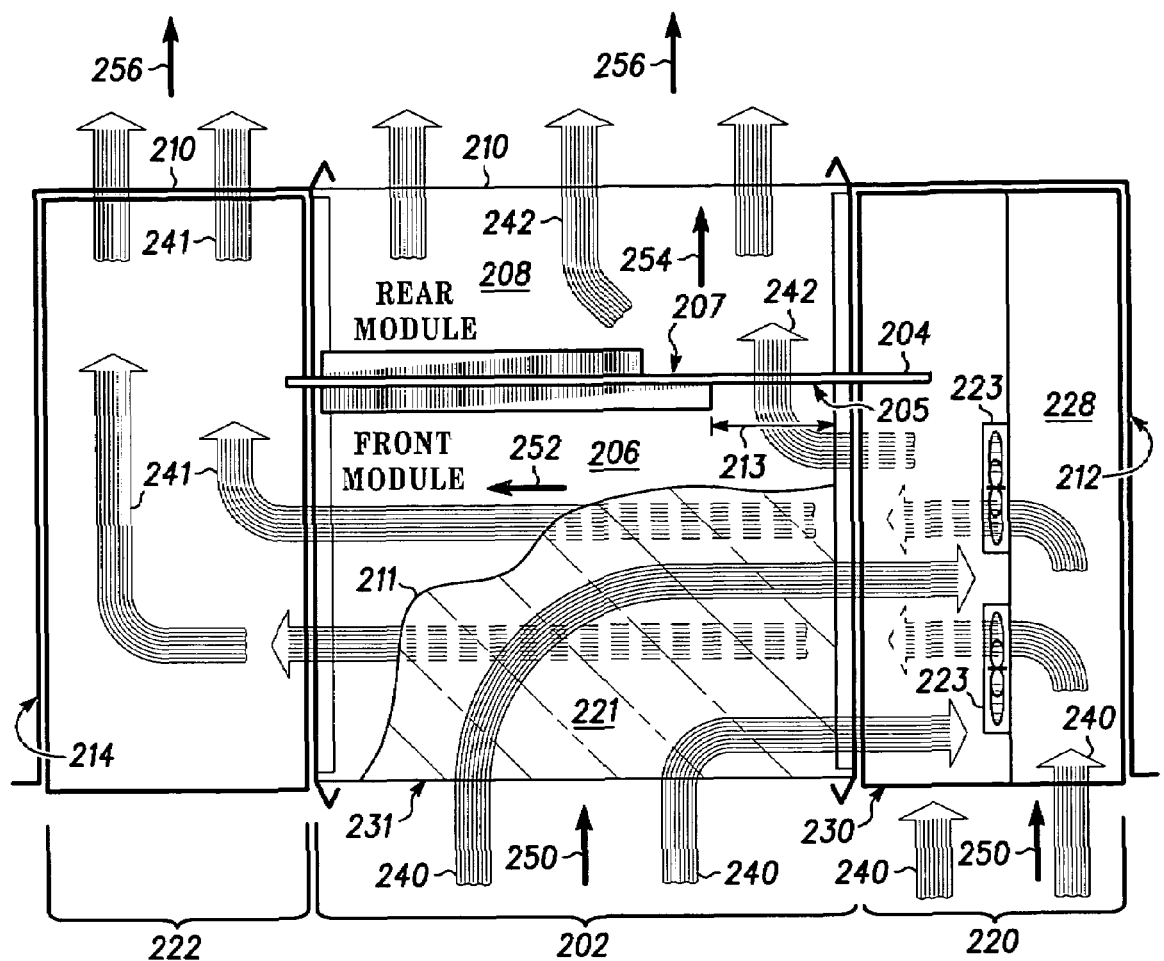
FIG. 3 is a top plan cut-away view of an embedded computer chassis in accordance with another embodiment of the invention.

FIG. 3 is a top plan cut-away view of an embedded computer chassis 200 in accordance with another embodiment of the invention. As shown in FIG. 2, embedded computer chassis 200 can be defined by a plurality of outer surfaces including a rear surface 210, first side surface 212 and second side surface 214, where rear surface 210 can be substantially perpendicular to both first side surface 212 and second side surface 214. Also, top surface 233 (shown in FIG. 2) can be substantially perpendicular to rear surface 210.

Embedded computer chassis 200 can include a module portion 202 coupled for receiving one or more modules. For example, module portion 202 can be coupled for receiving at least one of front module 206 or rear module 208. As an example, front module 206 can be coupled to front portion 205 of backplane 204, and rear module 208 can be coupled to rear portion 207 of backplane 204. Backplane 204 can include hardware and software necessary to implement a data network using the Advanced Telecom and Computing Architecture (AdvancedTCA™) topology as set forth in PCI Industrial Computer Manufacturers Group (PCIMG®) specifications 3.x, promulgated by PCIMG, 301 Edgewater Place, Suite 220, Wakefield, Mass. Backplane 204 is disposed substantially horizontal within embedded computer chassis 200 and substantially parallel to rear surface 210. The addition of more chassis to embedded computer chassis 100, backplane 204 can extend vertically as well as chassis are "stacked" with embedded computer chassis 200.

As an example of an embodiment, front module 206 can be a payload module, switch module, and the like. Rear module 208 can be a rear transition module to couple embedded computer chassis 200 to other chassis, networks devices, and the like. Each of front module 206 and rear module 208 can include a printed circuit board (PCB) having any number of electronic devices located thereon, for example, and without limitation, processors, memory, storage devices, I/O elements, and the like. In an embodiment, front module 206 and rear module 208 are substantially horizontally disposed analogous to the orientation of backplane 204.

In the exemplary embodiment depicted in FIG. 3, embedded computer chassis 200 can be a 1U chassis, which refers to the height, thickness, number of slots, and the like, of the embedded computer chassis 200. 1U modules can be coupled together and "stacked" to form a distributed computing system coupled to share resources from each 1U chassis. When stacked, backplane 204 can extend vertically to couple each of the stacked modules.

As an example of an embodiment, module portion 202 can be coupled to accommodate 8U form factor front module 206 and rear module 208. The invention is not limited to 8U modules. Any size modules, for example, 3U, 6U, 9U and the like, modules are within the scope of the invention. The "U" terminology is not limiting of the invention. As such, the invention is not limited to "U" as a form factor reference. Other form factor reference notations and increments are within the scope of the invention.

In an embodiment, module portion 202 includes separation plate 211 horizontally disposed between front module 206 and top surface 233, and between rear module 208 and top surface 233. In another embodiment, separation plate 211 can be horizontally disposed between only front module 206 and top surface 233. Separation plate 211 can operate to prevent incoming cooling air mass 240 from passing over front module 206 prior to entering first interspace region 220.

As shown in FIG. 3, first side surface 212, rear surface 210 and module portion 202 define first interspace region 220. In one embodiment, first interspace region 220 extends the height of embedded computer chassis 200. In another embodiment, first interspace region 220 extends a portion of the height of embedded computer chassis 200. The specific size and configuration of first interspace region 220 can be tailored by one skilled in the art to fit a specific application and be within the scope of the invention.

As shown in FIGS. 2 and 3, top surface 233 and separation plate 211 define second interspace region 221. Second interspace region 221 can include upper front surface 231, which is substantially perpendicular to top surface 233 and substantially parallel to front surface 230.

Second side surface 214, rear surface 210 and module portion 202 define third interspace region 222. In one embodiment, third interspace region 222 extends the height of embedded computer chassis 200. In another embodiment, third interspace region 222 extends a portion of the height of embedded computer chassis 200. The specific size and configuration of third interspace region 222 can be tailored by one skilled in the art to fit a specific application and be within the scope of the invention. In an embodiment of the invention, first interspace region 220 and second interspace region 222 operate as air plenums to facilitate cooling of plurality of module portion 202 and embedded computer chassis 200.

In an embodiment, first interspace region 220 can include any number of air-moving means 223, which can include, for example and without limitation, fans, blowers, and the like. Cooling air mass 240 can flow over one or both sides of modules. As an example of an embodiment, air-moving means 223 can include one or more muffin fans. The number and operating point of air-moving means 223 can be chosen to fit a particular application and is well within the abilities of one of ordinary skill in the art.

In an embodiment, air-moving means 223 is coupled to draw cooling air mass 240 into embedded computer chassis 200 through front surface 230 and upper front surface 231 in a direction substantially perpendicular 250 to front surface 230 and upper front surface 231. In a further embodiment, air-moving means 223 is coupled to push first portion of cooling air mass 241 over front module 206 in a direction substantially parallel 252 to backplane 204, upper front surface 231 and front surface 230. First portion of cooling air mass 241 can flow over one or both sides of front module 206.

In an embodiment, backplane 204 defines rear module cooling port 213, which can have one or more orifices designed to permit cooling air to flow to rear module 208. Air-moving means 223 can be coupled to further push second portion of cooling air mass 242 through rear module cooling port 213 and over rear module 208 in a direction substantially perpendicular 254 to backplane 204.

In an embodiment, third interspace region 222 is coupled to receive first portion of cooling air mass 241 after first portion of cooling air mass 241 passes over front module 206. Subsequently, cooling air mass 240 exhausts from embedded computer chassis through rear surface in a direction substantially perpendicular 256 to rear surface 210. In an embodiment, first portion of cooling air mass 241 can exhaust out a portion of rear surface 210 not coincident with rear module 208, and second portion of cooling air mass 242 can exhaust out a portion of rear surface 210 coincident with rear module 208.

Both rear surface 210 and rear module cooling port 213 can have one or more orifices, sized by one skilled in the art, to permit the passing of cooling air mass 240 or a portion of cooling air mass 240. The orifices can be sized such that first portion of cooling air mass 241 and second portion of cooling air mass 242 are proportioned as needed for a particular application.

Figure 4:
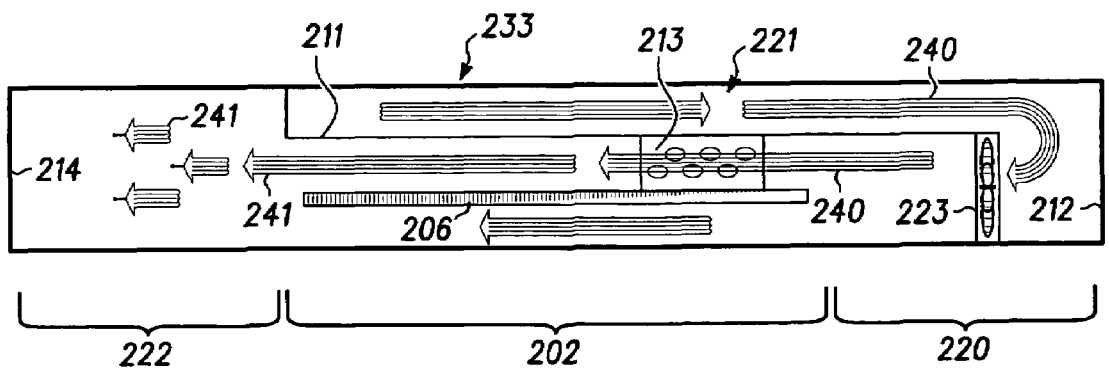
FIG. 4 is an interior elevation view of an embedded computer chassis in accordance with yet another embodiment of the invention.

FIG. 4 is an interior elevation view of an embedded computer chassis 200 in accordance with yet another embodiment of the invention. FIG. 4 along with FIGS. 2 and 3 further illustrate an embodiment of the invention. As shown in FIG. 4, cooling air mass 240 is drawn into embedded computer chassis 200 in a direction perpendicular 250 to front surface 230 and upper front surface 231.

Air-moving means 223 is coupled to push first portion of cooling air mass 241 over front module 206 in a direction substantially parallel 252 to backplane 204, upper front surface 231 and front surface 230. In an embodiment, first portion of cooling air mass 241 can flow over one or both sides of front module 206. Air-moving means 223 can be coupled to further push second portion of cooling air mass 242 through rear module cooling port 213, over rear module 208 in a direction substantially perpendicular 254 to backplane 204.

Third interspace region 222 is coupled to receive first portion of cooling air mass 241 after first portion of cooling air mass 241 passes over front module 206. Subsequently, cooling air mass 240 exhausts from embedded computer chassis through rear surface in a direction substantially perpendicular 256 to rear surface 210. In an embodiment, first portion of cooling air mass 241 can exhaust out a portion of rear surface 210 not coincident with rear module 208, and second portion of cooling air mass 242 can exhaust out a portion of rear surface 210 coincident with rear module 208.

While we have shown and described specific embodiments of the present invention, further modifications and improvements will occur to those skilled in the art. It is therefore, to be understood that appended claims are intended to cover all such modifications and changes as fall within the true spirit and scope of the invention.

This invention claimed is:

1. An embedded computer chassis, comprising:
  a plurality of outer surfaces comprising a rear surface, a first side surface and a second side surface, wherein the rear surface is substantially perpendicular to the first side surface and the second side surface;
  a module portion, comprising:
    a backplane disposed substantially vertically within the embedded computer chassis, wherein the backplane is substantially parallel to the rear surface;
    a front module coupled to a front portion of the backplane, wherein the front module is substantially horizontally disposed; and
    a rear module coupled to a rear portion of the backplane, wherein the rear module is substantially horizontally disposed;
  a first interspace region defined by the module portion, the first side surface and the rear surface;

a second interspace region defined by the module portion, the second side surface and the rear surface;

an integrated power supply air inlet unit coupled to slidably insert into the first interspace region, wherein the integrated power supply air inlet unit couples to the backplane, and wherein the integrated power supply air inlet unit further comprises:

a power supply coupled to supply power to the embedded computer chassis; and a front surface that is substantially perpendicular to the first side surface, wherein a cooling air mass is drawn into the embedded computer chassis through the front surface in a direction substantially perpendicular to the front surface; and an air-moving unit coupled to slidably insert into the second interspace region, wherein the air-moving unit is coupled to draw the cooling air mass over the front module in a direction substantially parallel to the backplane, and wherein the air-moving unit is coupled to push a first portion of the cooling air mass over the rear module in a substantially opposite direction substantially parallel to the backplane.

2. The embedded computer chassis of claim 1, wherein the integrated power supply air inlet unit is hot-swappable.

3. The embedded computer chassis of claim 1, wherein the air-moving unit is hot-swappable.

4. The embedded computer chassis of claim 1, wherein the embedded computer chassis is coupled to exhaust a second portion of the cooling air mass through a first portion of the rear surface in a direction substantially perpendicular to the rear surface.

5. The embedded computer chassis of claim 4, wherein the embedded computer chassis is coupled to exhaust the first portion of the cooling air mass through a second portion of the rear surface in a direction substantially perpendicular to the rear surface.

6. The embedded computer chassis of claim 5, wherein a ratio of the first portion of the rear surface to the second portion of the rear surface is between 0.5:2.0 and 2.0:0.5.

7. The embedded computer chassis of claim 5, wherein a ratio of the first portion of the rear surface to the second portion of the rear surface is substantially 1:1.

8. An integrated power supply air inlet unit coupled to slidably insert into a first interspace region of an embedded computer chassis, wherein the first interspace region is defined by a module portion, a rear surface and a first side surface, comprising:

a power supply coupled to supply power to the embedded computer chassis; and a front surface that is substantially perpendicular to the first side surface, wherein a cooling air mass is drawn into the embedded computer chassis through the front surface in a direction substantially perpendicular to the front surface, wherein upon entering the integrated power supply air inlet unit the cooling air mass is turned substantially ninety degrees to flow over the module portion in a direction substantially parallel the front surface, and wherein the integrated power supply air inlet unit is hot-swappable in the embedded computer chassis.

9. An embedded computer chassis, comprising:

a plurality of outer surfaces comprising a rear surface, a first side surface and a second side surface, wherein the rear surface is substantially perpendicular to the first side surface and the second side surface;

a module portion, comprising:

a backplane disposed substantially vertically within the embedded computer chassis, wherein the backplane is substantially parallel to the rear surface;

a front module coupled to a front portion of the backplane, wherein the front module is substantially horizontally disposed; and a rear module coupled to a rear portion of the backplane, wherein the rear module is substantially horizontally disposed;

a first interspace region defined by the module portion, the first side surface and the rear surface, wherein the first interspace region is coupled to receive an integrated power supply air inlet unit, wherein the integrated power supply air inlet unit is coupled to supply power to the embedded computer chassis, and wherein the integrated power supply air inlet unit comprises a front surface that is substantially perpendicular to the first side surface, wherein a cooling air mass is drawn into the embedded computer chassis through the front surface in a direction substantially perpendicular to the front surface; and a second interspace region defined by the module portion, the second side surface and the rear surface, wherein the second interspace region is coupled to receive an air-moving unit, wherein the air-moving unit is coupled to draw the cooling air mass over the front module in a direction substantially parallel to the backplane, and wherein the air-moving unit is coupled to push a first portion of the cooling air mass over the rear module in a substantially opposite direction substantially parallel to the backplane.

10. The embedded computer chassis of claim 9, wherein the integrated power supply air inlet unit is hot-swappable.

11. The embedded computer chassis of claim 9, wherein the air-moving unit is hot-swappable.

12. The embedded computer chassis of claim 9, wherein the embedded computer chassis is coupled to exhaust a second portion of the cooling air mass through a first portion of the rear surface in a direction substantially perpendicular to the rear surface.

13. The embedded computer chassis of claim 12, wherein the embedded computer chassis is coupled to exhaust the first portion of the cooling air mass through a second portion of the rear surface in a direction substantially perpendicular to the rear surface.

14. The embedded computer chassis of claim 13, wherein a ratio of the first portion of the rear surface to the second portion of the rear surface is between 0.5:2.0 and 2.0:0.5.

15. The embedded computer chassis of claim 13, wherein a ratio of the first portion of the rear surface to the second portion of the rear surface is substantially 1:1.

16. A method of cooling an embedded computer chassis, comprising:

providing the embedded computer chassis including a plurality of outer surfaces comprising a rear surface, a first side surface and a second side surface, wherein the rear surface is substantially perpendicular to the first side surface and the second side surface;

providing a module portion, comprising:

a backplane disposed substantially horizontally within the embedded computer chassis, wherein the backplane is substantially parallel to the rear surface;

a front module coupled to a front portion of the backplane, wherein the front module is substantially horizontally disposed; and a rear module coupled to a rear portion of the backplane, wherein the rear module is substantially horizontally disposed;

providing a first interspace region defined by the module portion, the first side surface and the rear surface, wherein the first interspace region is coupled to receive an integrated power supply air inlet unit;

providing the integrated power supply air inlet unit supplying power to the embedded computer chassis;

drawing a cooling air mass into the embedded computer chassis through a front surface of the integrated power supply air inlet unit in a direction substantially perpendicular to the front surface;

providing a second interspace region defined by the module portion, the second side surface and the rear surface, wherein the second interspace region is coupled to receive an air-moving unit;

wherein the air-moving unit drawing the cooling air mass over the front module in a direction substantially parallel to the backplane; and wherein the air-moving unit pushing a first portion of the cooling air mass over the rear module in a substantially opposite direction substantially parallel to the backplane.

17. The method of claim 16, wherein the integrated power supply air inlet unit is hot-swappable.

18. The method of claim 16, wherein the air-moving unit is hot-swappable.

19. The method of claim 16, further comprising exhausting a second portion of the cooling air mass through a first portion of the rear surface in a direction substantially perpendicular to the rear surface.

20. The method of claim 19, further comprising exhausting the first portion of the cooling air mass through a second portion of the rear surface in a direction substantially perpendicular to the rear surface.

21. The method of claim 20, wherein a ratio of the first portion of the rear surface to the second portion of the rear surface is between 0.5:2.0 and 2.0:0.5.

22. The method of claim 20, wherein a ratio of the first portion of the rear surface to the second portion of the rear surface is substantially 1:1.

23. A method of cooling a module portion of an embedded computer chassis, providing the module portion comprises a front module coupled to a front portion of a backplane, and a rear module coupled to a rear portion of the backplane, wherein the front module and the rear module are horizontally disposed, the method comprising:

providing a first interspace region coupled to receive an integrated power supply air inlet unit;

providing the integrated power supply air inlet unit supplying power to the embedded computer chassis;

drawing a cooling air mass into the embedded computer chassis through a front surface of the integrated power supply air inlet unit in a direction substantially perpendicular to the front surface;

providing a second interspace region coupled to receive an air-moving unit;

wherein the air-moving unit drawing the cooling air mass over the front module in a direction substantially parallel to the front surface; and wherein the air-moving unit pushing a first portion of the cooling air mass over the rear module in a substantially opposite direction substantially parallel to the front surface.

24. The method of claim 23, further comprising exhausting a second portion of the cooling air mass through a first portion of a rear surface in a direction substantially perpendicular to the rear surface.

25. The method of claim 24, further comprising exhausting the first portion of the cooling air mass through a second portion of the rear surface in a direction substantially perpendicular to the rear surface.

26. The method of claim 25, wherein a ratio of the first portion of the rear surface to the second portion of the rear surface is between 0.5:2.0 and 2.0:0.5.

27. The method of claim 25, wherein a ratio of the first portion of the rear surface to the second portion of the rear surface is substantially 1:1.

* * * * *